United States Patent [19]

McKee et al.

[11] Patent Number: 4,578,739
[45] Date of Patent: Mar. 25, 1986

[54] QUICK DISCONNECT AND FUNCTION CHANGE RADIO ASSEMBLY

[75] Inventors: John M. McKee; John F. MacDonald, both of Coral Springs, Fla.

[73] Assignee: Motorola, Inc., Schaumburg, Ill.

[21] Appl. No.: 486,474

[22] Filed: Apr. 19, 1983

Related U.S. Application Data

[63] Continuation of Ser. No. 310,697, Oct. 13, 1981, abandoned.

[51] Int. Cl.⁴ .................... H05K 1/18; H05K 11/00
[52] U.S. Cl. .................................. 361/395; 361/399; 361/422; 455/348; 455/349; 455/351
[58] Field of Search .............. 361/399, 395, 403, 419, 361/422; 455/348, 349, 350, 351

[56] References Cited

U.S. PATENT DOCUMENTS

| | | | |
|---|---|---|---|
| 3,760,486 | 7/1973 | Rifkin et al. | 361/399 |
| 3,770,889 | 11/1973 | Gutschick et al. | 455/348 X |
| 3,900,769 | 8/1975 | Russo, Jr. | 361/395 |
| 3,917,372 | 11/1975 | Selinko | 455/349 X |
| 4,081,751 | 3/1978 | Maddaloni | 455/349 X |
| 4,089,044 | 5/1978 | Gatto et al. | 455/348 X |
| 4,124,877 | 11/1978 | Vollenweider | 361/395 X |
| 4,131,934 | 12/1978 | Becker et al. | 361/395 X |
| 4,233,686 | 11/1980 | Sato | 455/351 X |
| 4,283,796 | 8/1981 | Hughes | 455/351 X |
| 4,295,181 | 10/1981 | Chang et al. | 361/399 X |

*Primary Examiner*—R. R. Kucia
*Attorney, Agent, or Firm*—Joseph T. Downey; Daniel K. Nichols; Edward M. Roney

[57] ABSTRACT

An assembly for a pager having a main housing that is generic to a family of papers having different outputs. A subassembly housing contains the output circuitry for each member of the family of pagers. A generic circuit is mounted on a circuit board that is slideable within the main housing between a first and second position. The circuit board, in a first position, allows the subassembly housing to mate with the main housing. The subassembly housing is locked into mated engagement with the main housing when the circuit board is slid from its first position to its second position. The locking engagement is provided by a tongue-like projection mounted on the circuit board which is received by a cavity in the subassembly housing when the circuit board slides to its second position. In conjunction with this flange mounted on the subassembly housing engages a first end of the circuit board.

12 Claims, 7 Drawing Figures

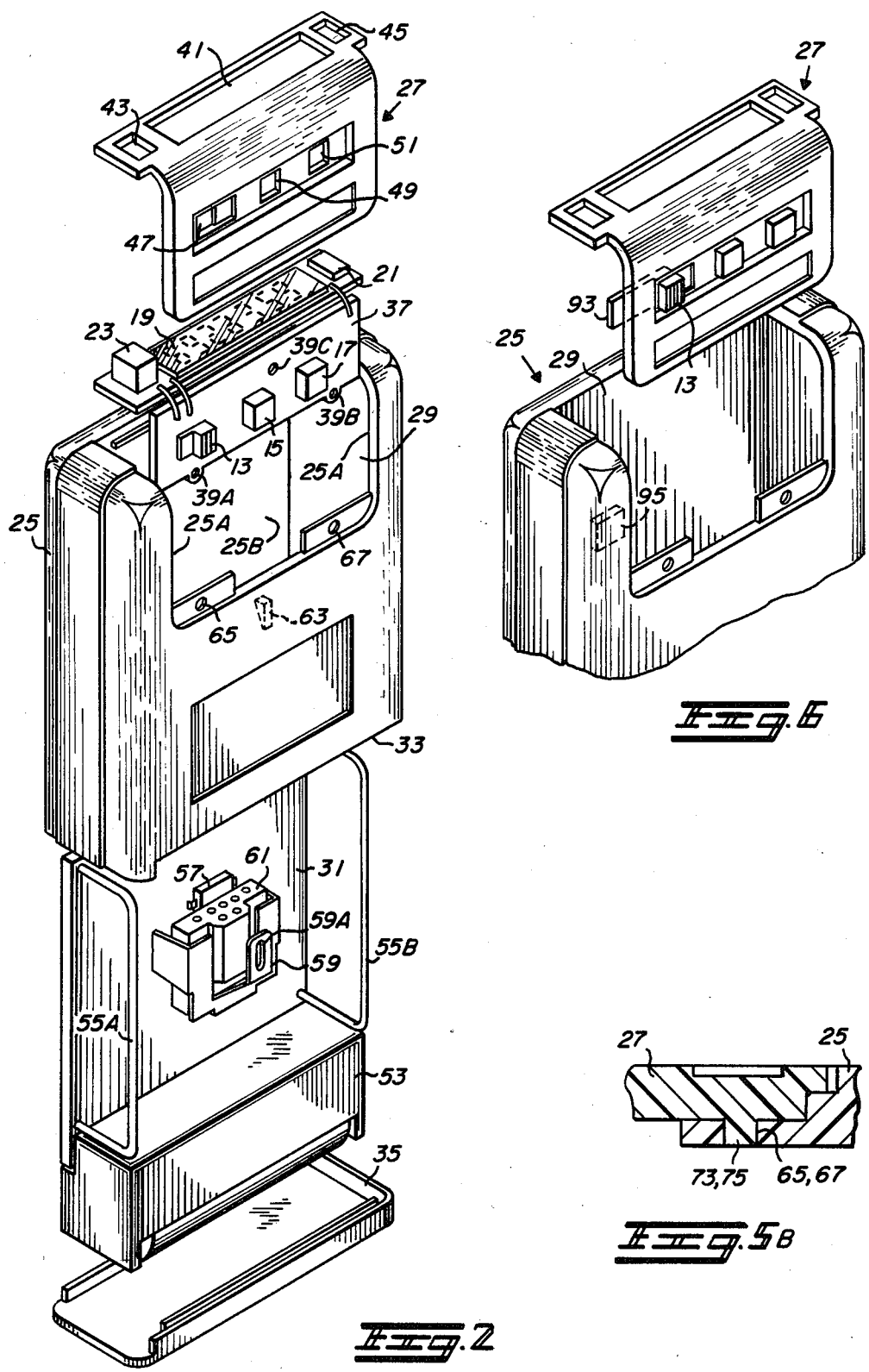

QUICK DISCONNECT AND FUNCTION CHANGE RADIO ASSEMBLY

This is a continuation of application Ser. No. 310,697, filed Oct. 13, 1981, now abandoned.

BACKGROUND OF THE INVENTION

The invention generally relates to a modular assembly for portable radio receivers having a subassembly allowing changes in the character of radio output and the main receiver assembly having means for attaching and locking the subassembly to the main receiver housing. More particularly, the invention relates to an assembly for a pager having means for quickly and easily engaging and disengaging various output control device subassemblies which interface with a generic radio frequency receiver enclosed in a main pager housing.

Many different annunication means are known to alert a pager user when a transmitted signal is received by the pager. Audio tone and voice output devices have been the most common, but there are also audiovisual display output devices and vibration output devices. In the past, each different type of alerting output has required a separate pager unit with individual assembly and component parts. This has been true even though each different type pager shares common component subsystems. In particular, the receiver portion of the pager's electronics is virtually identical in each different type pager unit. The decoder circuitry and alert circuitry are those portions of the pager which differ for pagers with different output devices. In the past even though a major portion of the pager device was common with other pagers having different output features, each pager had its own separate assembly. These separate assembly lines for devices with major common portions result in an unnecessary increase in manufacturing costs and duplication of inventory.

Recently attempts have been made to develop pagers whose main housing is generic to all the different output type paging devices. The object of this is to have the capability of changing a given pager from one output type to another while maintaining the same distinctive trade dress for the different pager types. These recent attempts have utilized a generic housing but have required a complete replacement of the internal component assembly. This meant only the housing shell was carried over from one system to another. Such a replacement ability allowed ease in manufacturing since only one main housing die was required for all the different pagers, but it offered little benefit to the user since to switch from one system to another required buying virtually a whole new pager while reusing only the comparatively inexpensive housing shell. There is a need for a modular construction for a pager which would have the flexibility to allow changes in pager output characteristics without a wholesale replacement of the pager internal components common to all types of pagers.

Problems have also existed in the assembly process of prior art pagers. Usually a pager is housed in a six sided box. For aesthetic reasons, it is desirable for the pager housing to have a minimal number of exposed support screws. A desire to simplify the pager assembly process combined with a desire for pleasing aesthetics, has commonly resulted in the use of only one side of the pager housing as an access opening to pager components. Usually all the internal components are mounted and arranged with respect to one another on a single component board so that they may slide as a unit into position within the housing cavity during assembly. Pursuant to the desire to simplify the assembly process, often the component board includes all externally accessible components, such as switches. The resulting assembly process is simply and easy but it is at the expense of a certain flexibility in the mounting of the externally available displays, switches and buttons. Push buttons (usually dome switches) or slide switches, to be functional, must protrude from the housing through openings. In an assembly arrangement where the pager internal components are on a single board that slides into place through a single side opening of the pager housing, the housing sides adjacent to the opened side are necessarily parallel to the line of travel of the internal components as the component board slides into place and are therefore practically excluded from having switches protruding from their surface plane. To include switches mounted on these adjacent walls would require some means of detenting their protruding portions as they slide into the housing cavity. Provisions could be made to accomplish this but it would cut away from the basic assembly objective of simplicity. In light of this, there is a need for a modular assembly that is as simple as the modular assemblies of the prior art yet allows the pleasing aesthetics of mounting switches on two adjacent housing sides.

Therefore it is an object of this invention to create a modular pager housing allowing easy assembly and a greater flexibility in the placement of displays, buttons and switches on the pager housing.

It is a further object of the invention to provide interchangable subassemblies for a pager which allows a generic radio receiver housing and circuitry to be complemented by a decoder and user alert subassembly circuit housed by a subassembly cover which is easily mechanically and electrically mounted onto the main housing of the generic receiver portion of the pager while simultaneously maintaining a pleasing aesthetic appearance.

SUMMARY OF THE INVENTION

An assembly for a pager having a first circuit portion generic to a family of pagers having different outputs. The particular outputs are defined by a second circuit portion unique to each different output type pager. There is a main housing for the generic circuit portion and a subassembly housing for the unique circuit portion. The generic circuit portion is mounted on a circuit board having a first and second end and slideable within said main housing between a first and second position. A tongue-like projection is mounted on the circuit board in proximity to and its second end. This forms part of an engagement system. A wedge projecting from the inside wall of the main housing is engaged with the tongue-like projection central slot. The wedge and slot engagement system operates like a pawl and stop system to prevent the circuit board from accidentally sliding out of the main housing during assembly or disassembly of the pager. A first signal conducting connector is also mounted on the circuit board.

The subassembly housing includes a receiving cavity for receiving the tongue-like projection. A second signal conducting connector is mounted on the subassembly housing for mating with the first signal conducting connector. Also a flange is mounted on said subassembly housing for engagement with said circuit board first end. The subassembly housing is mated with the main housing when the circuit board is in a first position. The first position of the circuit board draws the circuit board and the associated tongue-like projection and first connector out of engagement range with the corresponding mating locking parts on the subassembly housing. After the subassembly is placed in its mating position with the main housing, the circuit board is slid to its second position which engages the flange with the circuit board first end, the second connector with the first connector and the receiving cavity with the tongue-like projection. The circuit board second position locks the assembly together.

BRIEF DESCRIPTION OF THE DRAWINGS

FIG. 2 is an exploded view of the modular pager construction according to the invention.

FIG. 5b is a cross sectional view of a subassembly housing post fully mated with a main housing port for the main housing and subassembly housing position of FIG. 5a.

FIG. 6 is an exploded perspective view of an alternate embodiment of a pager main and subassembly housing according to the invention having a dead bolt locking mechanism associated with a slide switch mounted on the sub-assembly housing.

DESCRIPTION OF THE PREFERRED EMBODIMENT

Figure 1:
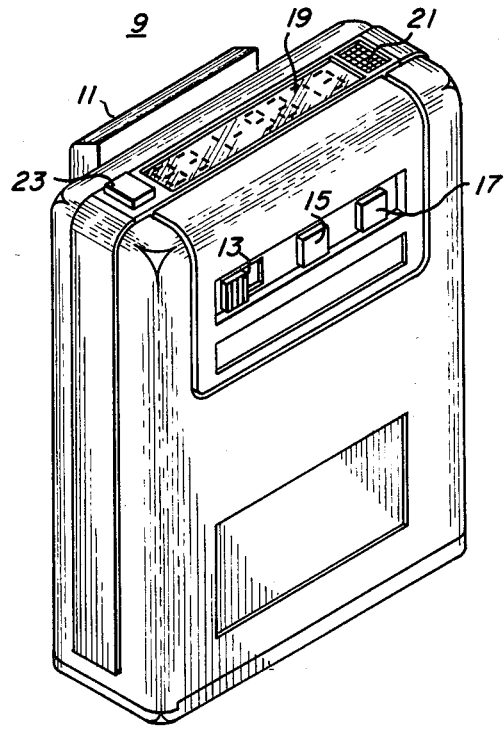
FIG. 1 is an assembled view of the modular pager construction according to the invention.

FIG. 1 shows an assembled pager according to the modular construction of the invention. The assembled pager 9 can be carried by the user on a belt buckle by using clamp 11 partially shown in FIG. 1. On-off switch 13 controls application of D.C. power from one or more batteries housed within the pager 9. Dome switches 15 and 17 control certain internal functions of the pager. Digital display 19 gives the user a visual read-out of transmitted information. Speaker 21 is a signal transducer which produces an audio signal which alerts the user to an incoming telephone number or other visual message, while interrogator button 23 accesses the digital display information available in a storage memory within the pager.

FIG. 2 is an exploded perspective view of the invention. Main housing 25 receives subassembly housing 27 at an opening 29 in the main housing 25. The two housing pieces are preferrably molded from a hard plastic. Circuit board 31 is slidably received by main housing 25 through battery opening 33. A battery hatch 35 closes battery opening 33 by sliding over the bottom portion of the main housing 25. The battery hatch 35 is preferrably molded of the same material as main housing 25 and subassembly housing 27.

Subassembly housing 27 has output control circuitry 37 secured to its inside walls by screws located at positions 39a - 39c. The output control circuitry 37 includes on-off slide switch 13, digital display 19, interrogator button 23, speaker annunciator or 21 and dome switches 15 and 17. The subassembly housing 27 includes ports for the various components of output control circuitry 37. In particular for the visual digital display subassembly of the preferred enbodiment of FIG. 1 there is a window 41 for viewing digital display 19, an opening 43 for interrogator button 23 and an opening 45 for a screen for an annunciator or speaker 21. Also there is an aperture 47 for on-off slide switch 13 and dome switch apertures 49 and 51 for dome switches 15 and 17 respectively.

Circiut board 31 includes a plastic battery compartment 53, antenna 55a and 55b, electrical components 57, a resilient locking tongue 59 and a plastic female connector 61. Tongue 59 is preferably constructed of a resilient metal such as spring steel. The battery compartment 53 serves to house the batteries used to power the electronics of the pager. Antenna 55a and 55b serves as a guide rail to position circuit board 31 within the main housing 25. The height of the antenna 55a and 55b is approximately equal to the depth of the cavity defined by the inside walls of the main housing 25. Therefore, the top length of guide rails 55a and 55b are in contact with the inside walls of a front portion 25a of the main housing 25 when the circuit board 31 is fully engaged with the main housing 25. When fully engaged in main housing 25, circuit board 31 itself rests against the inside walls of a back portion 25b of main housing 25. Resilient locking tongue 59 has a slotted end 59a which engages a wedge 63 (shown in phantom in FIG. 2) when circuit board 31 is inserted into main housing 25. Wedge 63 is a integral projection of the main housing inside front wall 25a. The interaction of tongue slotted end 59a and wedge 63 is like a pawl and stop as will be explained more fully with respect to FIG. 4. Ports 65 and 67 receive posts 73 and 75 respectively projecting from the inside wall of subassembly housing 27 (shown in FIG. 3).

This modular assembly of the invention allows the pager to be easily changed from one type of output to another without requiring the exchange of all internal components. The main housing 25 serves as a generic housing for a family of pagers having different type outputs. The circuit board 31 enclosed by main housing 25 includes the portion of the pager electronics which defines the receiver. The output control circuitry 37 is attached to and housed by the subassembly housing 27. The particular type of output control circuitry depends on the type of pager that the user desires. For each different type of pager there is required a unique subassembly since the output control circuitry, external displays and switches differ from one pager type to another. But the main housing 25 and circuit board 31 remain generic to all different type pagers.

Since the pager circuitry is in two housing modules there is a certain flexibility available that has not been available in many prior art pager assemblies which strive for a simple construction. With subassembly housing 27 having most if not all of the circuitry which requires external switches or buttons it becomes conveniently expedient to mount all the switches and buttons on the subassembly housing 27. By the nature of the pager assembly, the subassembly housing 27 can feature buttons and switches on two adjacent sides which is a feature not practical under prior art construction. When the pager 9 is fully assembled, the output control circuitry 37 of the subassembly housing 27 and the electrical components 57 of circuit board 31 are electrically connected by male and female connectors respectively mounted on subassembly housing 27 and on circiut board 31. This is more fully explained in connection with FIG. 3.

Figure 3:
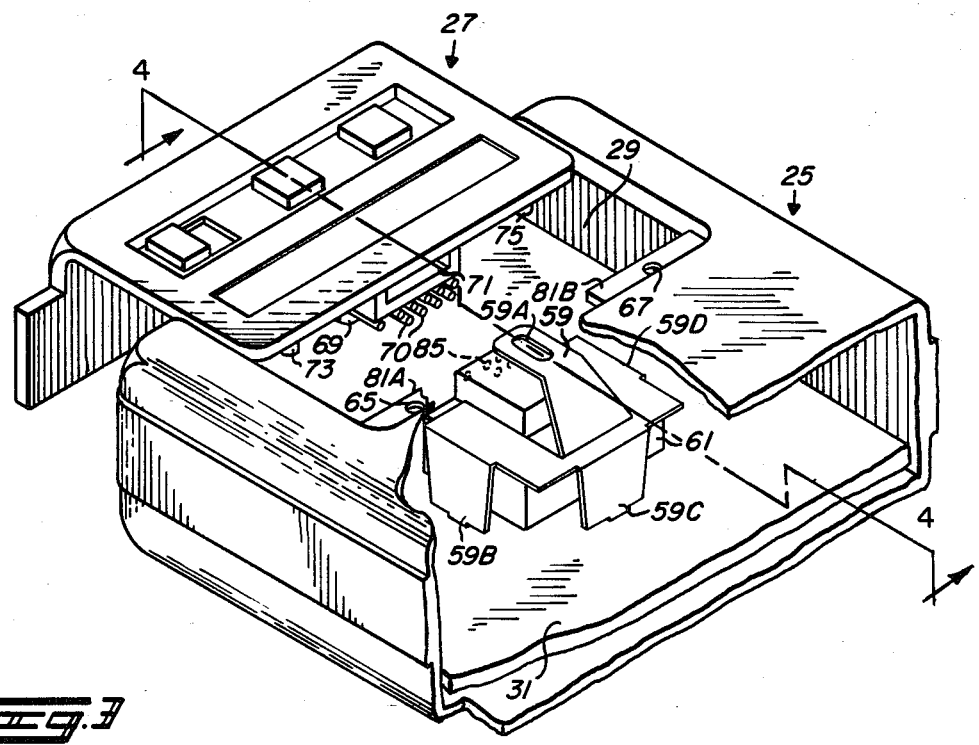
FIG. 3 is an exploded perspective view of male and female electrical connector portions which connect main housing circuit components wth subassembly housing circuit components according to the invention and an elevated perspective view of male and female mechanical connector portions which lock a subassembly housing in place with a main housing according to the invention.

FIG. 3 shows an exploded perspective view of resilient locking tongue 59, female connector 61 and subassembly housing 27 with a plastic male connector 69, and associated conductive metal connector pins 70, cavity 71 and posts 73 and 75. Also main housing 25 is partially shown. Resilient tongue 59 includes legs 59b - 59d which support both tongue 59 and female connector 61 on the surface of the circuit board 31. Ports 65 and 67 are respectively located on main housing tabs 81a and 81b. The tabs are recessed with respect to the plane of the front surface of main housing 25. The recess is sufficient to allow subassembly housing 27 to seat in opening 29 flush with the surface of main housing 25. Ports 65 and 67 on tabs 81a and 81b receive posts 73 and 75 on subassembly housing 27 when the subassembly is mated with the main housing 25. The ports 65 and 67 and posts 73 and 75 in combination with resilient tongue 59 and cavity 71 lock main housing 25 and subassembly housing 27 together as one unit as will be explained more fully in connection with FIG. 5b.

Connector pins 70 mate with conductive pin slots 85 in female connector 61 when the pager 9 is assembled. The male and female connectors provide the electrical link between circuit board 31 in main housing 25 and output circuitry 37 in subassembly housing 27. For any different output type subassemblies 27 the male connector 69 and its connector pins 70 are the same. for subassembly housing 27 there is different output control circuitry 37 and a different external appearance for different type outputs (i.e. visual, audio, vibration). But male connector 69 is identical in every subassembly housing 27 as is necessary for there to be interchangability with generic main housing 25. Also for interchangability all different subassemblies 27 must have the same mechanical attachment means. The steps involved in mechanically joining the subassembly housing 27 with the main housing 25 will be explained more fully in connection with FIGS. 4, 5a and 5b.

Figure 4:
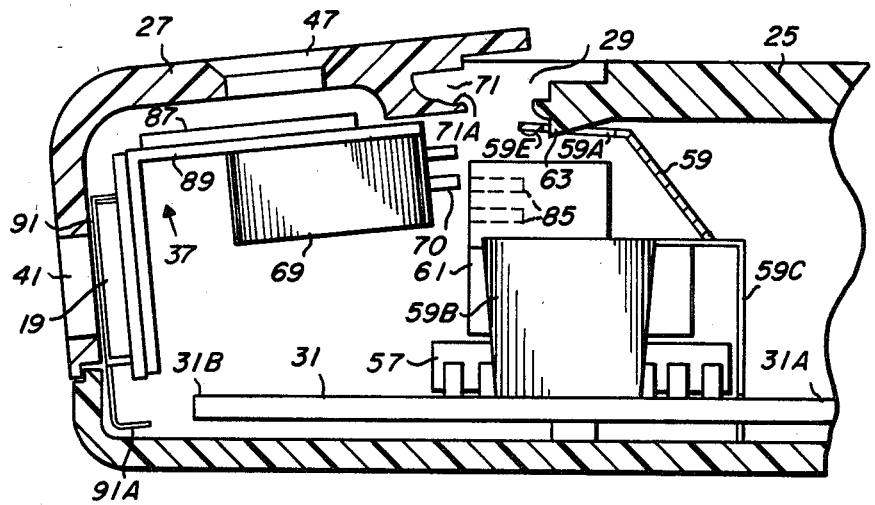
FIG. 4 is a cross-sectional view of a pager according to the invention along a plane defined by the line 4—4 in FIG. 3, illustrating a circuit board assembly within the pager main housing in a first position which allows the pager subassembly housing to engage the main housing assembly's mating opening.

FIG. 4 is a cross sectional view of the invention as shown along a plane passing through line 4—4 in FIG. 3, showing the appropriate position of circuit board 31 in main housing 25 for seating subassembly housing 27 into opening 29 in main housing 25. The cross-section shows a circuit board first end 31a and a circiut board second end 31b. Receiver component circuitry is illustrated by single chip 57. Chip 57 is for purposes of illustration only, since the actual receiver cicuitry obviously comprises more than a single chip. Resilient tongue 59 and female connector 61 are supported by tongue legs 59b, 59c, and 59d (shown in FIG. 3). A surface protuberance in the shape of a knob 59e is formed on the underside of resilient tongue 59 for ease in the physical contact of the walls defining cavity 71. Correspondingly, cavity 71 has a bevel 71a for ease in the joining of cavity 71 with tongue knob 59e. Output control circuitry 37 includes a digital display 19 and switch circuitry 87 with associated switch aperture 47 in subassembly housing 27 for switch 13. Digital display 19 is mounted on a control mounting bracket 89 and held in place by bezel 91 secured to bracket 89. A flange 91a is formed at one end of bezel 91 for mechanical engagement of circuit board end 31b. Bezel 91 and flange 91a are preferrably brass, but can be any suitable material. Flange 91a can also be formed from one end of control mounting bracket 89.

Circuit board 31 can slide along the length of main housing 25 limited only by the interference of the pawl and stop system comprising tongue slot 59a engagement with wedge 63. As the first step in assembly of the two housing pieces, with the battery hatch 35 removed, the circuit board 31 is pulled to the right as far as the pawl and stop, tongue slot 59a and wedge, will allow as shown in FIG. 4. The circuit board 31 is placed into this position by pulling on circuit board end 31a with an appropriate instrument by way of battery hatch opening 35. With the circuit board 31 in this position the subassembly housing 27 is lowered into place over main housing opening 29.

Figure 5A:
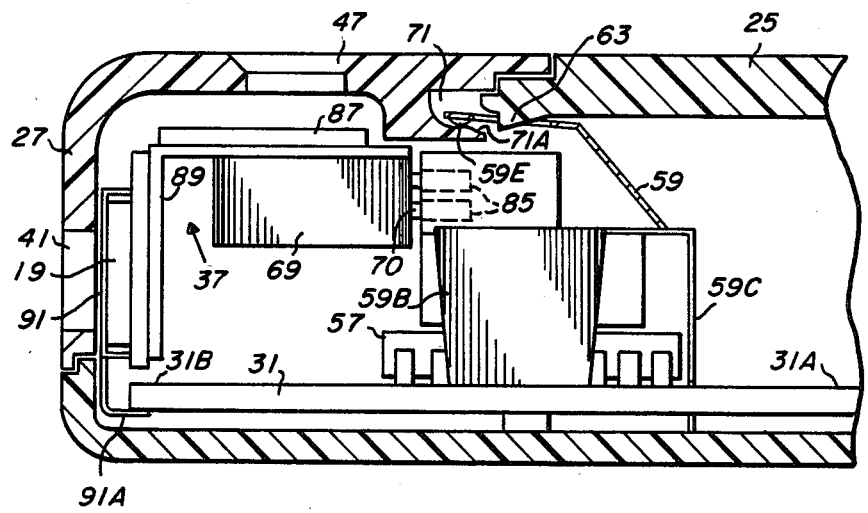
FIG. 5a is the cross sectional view of a pager according to the invention as shown in FIG. 4 with the circuit board assembly in a second position which locks the main housing and subassembly housing into a single unit.

FIG. 5a is a cross section showing a fully assembled main housing 25 and subassembly housing 27 in locked engagement. From its position in FIG. 4, circuit board 31 is pushed to the left by way of battery hatch opening 33 through the use of finger pressure or an appropriate tool. Resilient tongue 59 engages slot 71 and circuit board end 31b engages flange 91a of digital display bracket 91. By first seating subassembly housing 27 on main housing opening 29 and then sliding circuit board 31 and the associated female connector 61 and tongue 59 into engagement, a two step process is created which guarantees both that the subassembly housing 27 is locked into place and also that male connector 69 is properly mated with female connector 61.

In operation, small knob 59e on the underside of the tip of resilient tongue 59 engages the subassembly housing 27 at the lower surface wall of cavity 71. As circuit board 31 is pushed toward the left in FIG. 5a the tongue knob 59e moves up the bevel 71a causing the tongue 59 to yield laterally. The beveled portion 71a of cavity 71 allows resilient tongue 59 to first engage slot 71 in a relaxed or unstressed condition. As the tongue 59 yields laterally, it resists bending with a force applied against the bottom of cavity 71. This interaction of the bottom wall of cavity 71 and the tip of tongue 59 results in the subassembly housing 27 being held in tight engagement with main housng 25.

To dissemble the pager 9 the assembly steps are simply performed in reverse order. To completely remove circuit board 31 from main housing 25 resilient tongue 59 must be flexed down toward the surface of circuit board 31 until tongue slot 59a clears wedge 63 and allows the circuit board 31 and attached tongue 59 to slide out the battery opening 33. The resilient tongue 59 can be flexed sufficiently by a force applied with a finger tip or an appropriate tool. With circuit board 31 removed from main housing 25, subassembly housing 27 can be connected to circuit board 31 to form a functioning unit yet allowing access to test points on the circuit board 31 underplane for purposes of trouble shooting a malfunctioning unit. On a test bench, a first mechanical connection between subassembly 27, slot 71 and resilient tongue 59 and a second mechanical connection between flange 91a and circuit board end 31b hold male connector 69 in stable electrical contact with female connector 61. This frees the technician from being forced to juryrig a test set-up.

FIG. 5b shows a cross-section of post 73 and port 77 in full engagement. Post 75 engagement with port 79 is defined by an identical cross-section. Ports 65 and 67 receive posts 73 and 75 when main housing 25 is mated with subassembly housing 27. Posts 73 and 75 function to hold subassembly housing 27 in its mated position in opening 29 of main housing 25 as circuit board 31 is pushed into its assembled position (shown in FIG. 5a). As the circuit board 31 is pushed into its assembled position the interaction of tongue 59 and cavity 71 results in both a downward and leftward force (in FIG. 5a) on the subassembly housing 27. This leftward force tends to push the subassembly housing 27 away from its mated position on main housing 25. To resist this force, posts 73, 75 and ports 65, 67 have been included in the subassembly housing 27 and main housing 25 respectively. Therefore the subassembly will not be prone to move away from its seated position over opening 29 in response to forces generated during engagement of tongue 59 with cavity 71.

FIG. 6 is an exploded perspective view of a security means for retention of subassembly 27 to main housing 25. The pager 9 assembly shown in FIGS. 1-5 could include a latch 93 on subassembly housing 27 and latch hole 95 in main housing 25. Latch 93 is connected to slide switch 13. Latch 93, latch surface 95 and slide switch 13 combine to act as a dead bolt lock holding the two housing pieces in their mated position. Preferably the slide switch is an on-off switch with the off position being the switch position shown in FIG. 6. The latch 93, in FIG. 6, is shown in its fully extended position. When subassembly housing 27 is mated with main housing 25 and switch 13 in its off position, latch 93 and latch surface 95 are in a dead bolt arrangement which prevents subassembly 27 from being dislodged from its mated position with main housing 25. Latch 93 and latch surface 95 support post 73, 75 and ports 65, 67 in preventing undesired movement of subassembly 27 as circuit board 31 is moved from its first or second position during disassembly or assembly.

In summary, the pager assembly of the invention provides a versatile modular construction which offers increased cost effectiveness through separation of generic and unique circuitry for different character pagers while maintaining mechanical and electrical module interconnections that are both simple and reliable.

We claim:

1. An assembly for devices having a generic circuit portion and a unique circuit portion, said assembly comprising,
   a main housing for said generic circuit portion having at least one inside wall and at least one outside wall,
   a subassembly housing for said unique circuit portion, having an inside and outside wall,
   a circuit board within said main housing for the components of said generic circuit portion, said circuit board having a first and second end, and slideable within said main housing between a first and second position,
   a tongue-like projection having a first end attached to said circuit board and having a second end with a central slot,
   a wedge integral with said inside wall of said main housing and engagng said tongue-like projection central slot so as to limit the amount said circuit board can slide in a first direction, to said first position,
   a receiving cavity in said subassembly housing for receiving and engaging said tongue-like projection,
   a first signal conducting connector mounted on said subassembly housing,
   a second signal conducting connector mounted on said circuit board for engagement with said first signal conducting connector when said circuit board slides in a second direction, to said second position,
   a flange mounted on said subassembly housing to receive and engage said circuit board first end when said circuit board slides to said second position, and
   whereby said flange engagement of said circuit board first end and said tongue-like projection engagement of said receiving cavity provides a mechanical coupling which locks said main housing and said subassembly housing together.

2. An assembly in accordance with claim 1, including a slideable latch mounted on said inside wall of said subassembly housing,
   said latch having a switch portion accessable from said outside wall of said subassembly housing and capable of switching said latch to a first or second position,
   a latch surface formed in said main housing and receiving said latch when said switch portion is in said latch second position.

3. An assembly in accordance with claim 1, including a post integral with said inside wall of said subassembly housing
   a port in said main housing which receives said post thereby holding said subassembly housing in its mated position with said main housing while said circuit board slides from said first position to said second position.

4. A subassembly of a device for mating with both a main housing of said device and a two position circuit board with said main housing with said circuit board having a first and second end and having mounted thereon a circuit board connector and a tongue-like projection with a central slot, said subassembly comprising,
   a subassembly housing having an inside and outside wall,
   a receiving cavity in said subassembly housing for engagement with said tongue-like projection when said circuit board is in a second position,
   circuitry mounted on said inside wall of said subassembly housing,
   a signal conducting connector mounted on said inside wall of said subassembly housing for engagement with said circuit board connector when said circuit board is in a second position,
   a flange mounted on said subassembly housing to engage said circuit board first end when said circuit board is in a second position, and
   whereby when said circuit board, with said circuit board connector and tongue-like projection mounted thereon, is in a first position, said subassembly mates freely with said main housing and thereafter locks to said main housing when said circuit board is in a second position.

5. A subassembly in accordance with claim 4, including, a sideable latch mounted on said inside wall of said subassembly housing, said latch having a switch portion accessible from said outside wall of said subassembly housing and capable of sliding said latch from a first to a second position, whereby said subassembly mates to said main housing when said latch is in a first position and said subassembly locks to said main housing when said latch is in a second position.

6. A subassembly in accordance with claim 4, including, a post integral with said inside wall of said subassembly, said post mates with said main housing and deters movement of said subassembly when said circuit board changes from a second to a first position.

7. An assembly for devices having a generic circuit portion and a unique circuit portion, said assembly comprising, a main housing for said generic circuit portion having at least one inside wall and at least one outside wall, a subassembly housing for said unique circuit portion, having an inside and outside wall, a circuit board within said main housing for the components of said generic circuit portion, said circuit board having a first and second end, and slideable within said main housing between a first and a second position, a pawl-like projection having a first end attached to said circuit board, a pawl stop means adjacent said outside wall of said main housing for engaging said pawl-like projection so as to limit the amount said circuit board can slide in a first direction, to said first position, a receiving cavity in said subassembly housing including projection engagement means for receiving and engaging said pawl-like projection, a first signal conducting connector mounted on said subassembly housing, a second signal conducting connector mounted on said circuit board for engagement with said first signal conducting connector when said circuit board slides in a second direction, to said second position, a flange mounted on said subassembly housing to receive and engage said circuit board first end when said circuit board slides to said second position, and whereby said flange engagement of said circuit board and said pawl-like projection engagement of said receiving cavity means provides a mechanical coupling which locks said main housing and said subassembly housing together.

8. An assembly in accordance with claim 7 wherein said pawl-like projection further includes a slot adjacent the unattached end and said pawl stop means comprises a wedge integral with said inside wall of said main housing.

9. An assembly in accordance with claim 7, including a slideable latch mounted on said inside wall of said subassembly housing, said latch having a switch portion accessible from said outside wall of said subassembly housing and capable of switching said latch from a normal to an extended position, a latch surface formed in said main housing and receiving said latch when said switch portion is in said extended position.

10. In a radio receiver, a subassembly including a unique circuit portion for mating with both a main housing of said device and a generic circuit board within said main housing, with said generic circuit board having a first and second end and having further mounted thereon a circuit board connector and a pawl-like projection said subassembly comprising, a subassembly housing having an inside and outside wall, a receiving cavity in said subassembly housing for engagement with said pawl-like projection when said circuit board is in a second position, unique circuitry mounted on said inside wall of said subassembly housing including a user accessible switch and an annunciator;

a signal conducting connector mounted on said inside wall of said subassembly housing for engagement with said circuit board connector when said circuit board is in a second position, a flange mounted on said subassembly housing to engage said circuit board when said circuit board is in a second position, and whereby when said circuit board, with said circuit board connector and pawl-like projection mounted thereon, is in a first position, said subassembly mates freely with said main housing and thereafter locks to said main housing when said circuit board is in a second position to mechanically and electrically couple said unique circuit to said generic circuit.

11. A subassembly in accordance with claim 10, including, a slideable latch mounted on said inside wall of said subassembly housing, said latch having a portion accessible from said outside wall of said subassembly housing and capable of sliding said latch to a normal or extended position, whereby said subassembly mates to said main housing when said latch is in a normal position and said subassembly locks to said main housing when said latch is in an extended position.

12. A subassembly in accordance with claim 10, wherein said user accessible switch is a main off/on switch for said unique and generic circuits.

* * * * *